United States Patent
Yang et al.

(10) Patent No.: US 11,177,447 B2
(45) Date of Patent: Nov. 16, 2021

(54) FLEXIBLE DISPLAY AND MANUFACTURING METHOD THEREOF

(71) Applicant: ASUSTeK COMPUTER INC., Taipei (TW)

(72) Inventors: Fei-Lin Yang, Taipei (TW); Bin-Yi Lin, Taipei (TW); Yang-Po Chiu, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 32 days.

(21) Appl. No.: 16/053,933

(22) Filed: Aug. 3, 2018

(65) Prior Publication Data

US 2019/0058141 A1 Feb. 21, 2019

(30) Foreign Application Priority Data

Aug. 17, 2017 (TW) ................................. 106127984

(51) Int. Cl.
  *H01L 51/00* (2006.01)
  *H01L 51/56* (2006.01)
  *H01L 27/32* (2006.01)
  *H01L 51/52* (2006.01)

(52) U.S. Cl.
  CPC ...... *H01L 51/0097* (2013.01); *H01L 51/0013* (2013.01); *H01L 51/56* (2013.01); *H01L 27/3244* (2013.01); *H01L 27/3281* (2013.01); *H01L 51/003* (2013.01); *H01L 51/5253* (2013.01); *H01L 2251/5338* (2013.01)

(58) Field of Classification Search
  CPC .............. H01L 51/003; H01L 51/0097; H01L 51/5253; H01L 51/5256; H01L 51/5246; H01L 2251/5338
  See application file for complete search history.

(56) References Cited

U.S. PATENT DOCUMENTS

| 6,210,744 | B1* | 4/2001 | Hayess | C23C 14/228 |
| | | | | 427/8 |
| 2002/0125822 | A1* | 9/2002 | Graff | H01M 50/183 |
| | | | | 313/506 |
| 2010/0178452 | A1* | 7/2010 | Yoon | G02F 1/133305 |
| | | | | 428/107 |
| 2010/0237380 | A1* | 9/2010 | Tanaka | H01L 27/1214 |
| | | | | 257/99 |
| 2013/0037832 | A1* | 2/2013 | Kang | C22C 1/002 |
| | | | | 257/88 |
| 2015/0129846 | A1* | 5/2015 | Lang | H01L 51/5275 |
| | | | | 257/40 |

FOREIGN PATENT DOCUMENTS

| CN | 103014644 A | 4/2013 |
| CN | 105177468 A | 12/2015 |
| CN | 106048526 A | 10/2016 |

* cited by examiner

*Primary Examiner* — Jesse Y Miyoshi
(74) *Attorney, Agent, or Firm* — McClure, Qualey & Rodack, LLP

(57) ABSTRACT

A method for manufacturing a flexible display includes forming a coating film. Forming the coating film includes depositing a high rigidity material layer on a substrate and forming a transfer layer on the high rigidity material layer. The coating film is bonded to a display surface of a display panel by the transfer layer. The substrate is removed after the coating film is bonded to the display surface of the display panel.

5 Claims, 4 Drawing Sheets

100

```
┌─────────────────────────────────────────────────────────────┐
│                 a substrate is provided                     │ ～1001
└─────────────────────────────────────────────────────────────┘
                              ↓
┌─────────────────────────────────────────────────────────────┐
│  a high rigidity material layer is deposited on the substrate at a first │ ～1002
│  temperature by a first deposition process in a processing chamber       │
└─────────────────────────────────────────────────────────────┘
                              ↓
┌─────────────────────────────────────────────────────────────┐
│  a transfer layer is formed on the high rigidity material layer at a     │
│  second temperature by a second deposition process in the processing    │ ～1003
│  chamber of the process system to form the coating film, and the second │
│  temperature is lower than the first temperature                         │
└─────────────────────────────────────────────────────────────┘
                              ↓
┌─────────────────────────────────────────────────────────────┐
│  the process environment of the processing chamber is de-vacuumed and   │ ～1004
│  the coating film is removed from the processing chamber                │
└─────────────────────────────────────────────────────────────┘
                              ↓
┌─────────────────────────────────────────────────────────────┐
│         the display surface of the display panel is cleaned             │ ～1005
└─────────────────────────────────────────────────────────────┘
                              ↓
┌─────────────────────────────────────────────────────────────┐
│  a liquid silicon oxide is coated on the display surface of the display │ ～1006
│                                panel                                    │
└─────────────────────────────────────────────────────────────┘
                              ↓
┌─────────────────────────────────────────────────────────────┐
│  the coating film and the substrate are attached to the side of the display │ ～1007
│  panel close to the display surface via the transfer layer              │
└─────────────────────────────────────────────────────────────┘
                              ↓
┌─────────────────────────────────────────────────────────────┐
│  the substrate is removed to complete the manufacture of the flexible   │ ～1008
│                               display                                   │
└─────────────────────────────────────────────────────────────┘
```

FIG. 2

FLEXIBLE DISPLAY AND MANUFACTURING METHOD THEREOF

CROSS-REFERENCE TO RELATED APPLICATION

This application claims the priority benefit of Taiwan application serial No. 106127984, filed on Aug. 17, 2017. The entirety of the above-mentioned patent application is hereby incorporated by reference herein and made a part of specification.

BACKGROUND OF THE INVENTION

Field of the Invention

The disclosure relates to a flexible display and a manufacturing method thereof.

Description of the Related Art

In general, the material of a substrate of a flexible display is polyethylene terephthalate (PET), Cycloolefin polymer (COP), and polyetherimide. Polyetherimide (PEI) or Polyethersulphone (PES). An external wet coating film is applied to the aforementioned substrate to enhance the scratch resistance of the flexible display. However, the scratch resistance of a flexible display is limited by the film ability formed by the wet coating film.

BRIEF SUMMARY OF THE INVENTION

According to a first aspect of the disclosure, a method for manufacturing a flexible display is provided. The method comprises: depositing a high rigidity material layer on a substrate; forming a transfer layer on the high rigidity material layer to form a coating film; bonding the coating film to a display surface of a display panel by the transfer layer; and removing the substrate after bonding the coating film to the display surface of the display panel.

According to a second aspect of the disclosure, a flexible display is provided. The flexible display comprises: a display panel; and a coating film, including: a transfer layer, disposed on the display panel; and a high rigidity material layer, disposed on the transfer layer.

BRIEF DESCRIPTION OF THE DRAWINGS

FIG. 2 shows a flowchart of a method for manufacturing the flexible display in some embodiments.

DETAILED DESCRIPTION OF THE EMBODIMENTS

Figure 1:
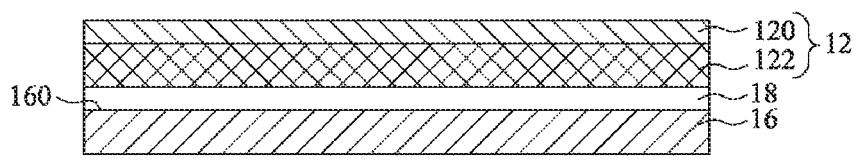
FIG. 1 shows a cross-sectional view of a flexible display in an embodiment.

Please refer to FIG. 1, and FIG. 1 shows a cross-sectional view of a flexible display 1 in an embodiment. As shown in FIG. 1, the flexible display 1 includes a display panel 16, an adhesive layer 18, and a coating film 12. The coating film 12 includes a transfer layer 122 and a high rigidity material layer 120. In an embodiment, the flexible display 1 is an Active Matrix Organic Light Emitting Diode (AMOLED) or a Passive Matrix Organic Light Emitting Diode (PMOLED), which is not limited herein.

In FIG. 1, the adhesive layer 18 is disposed on a display surface 160 of the display panel 16. In the present embodiment, the material of the adhesive layer 18 is a liquid silicon oxide, and the thickness of the adhesive layer 18 is substantially less than 2 micrometers ($\mu$m). Thereby, the adhesive layer 18 can increase the adhesion degree between the display panel 16 and the coating film 12. In other embodiments, the adhesive layer 18 is omitted in the flexible display 1.

In FIG. 1, the transfer layer 122 is disposed on a side of the display panel 16 close to the display surface 160. The transfer layer 122 is disposed on the adhesive layer 18. In the embodiment, the material of the transfer layer 122 is silicon oxide ($Si_xO_y$, wherein X is substantially between 0.5 and 2, and Y is between 2 and 5), and the thickness of the transfer layer 122 is essentially between 0.05 micrometers ($\mu$m) and 0.5 micrometers ($\mu$m). Thereby, the transfer layer 122 is able to attach the high rigidity material layer 120 to the adhesive layer 18.

In FIG. 1, the high rigidity material layer 120 is disposed on the transfer layer 122 and is illustrated as a single layer structure. In other embodiments, the high rigidity material layer 120 is a multi-layer structure. In the present embodiment, the high rigidity material layer 120 provides high rigidity characteristics, which provides sufficient structural strength at a thinner thickness, and insulates water or liquid from entering the flexible display 1.

In some embodiments, the high rigidity material layer 120 is an amorphous alloy film or a cermet film. In the present embodiment, the amorphous alloy film is an alloy formed by a plurality of metals or an alloy formed by a metal and a non-metal (for example, boron (B), phosphorus (P), or germanium (Si)). For example, the aforementioned alloy formed by a plurality of metals includes a copper-zirconium eutectic alloy ($Cu_{60}Zr_{40}$), a neodymium-eutectic alloy ($La_{76}Au_{24}$), or a uranium-chromium eutectic alloy ($U_{70}Cr_{30}$), and the foregoing alloy formed by a metal and a non-metal includes an iron-boron eutectic alloy ($Fe_{80}B_{20}$), an iron-nickel oxy-eutectic alloy ($Fe_{40}Ni_{40}Pi_{40}O_6$). For example, in the present embodiment, the amorphous alloy film is a metal zirconium compound. In some embodiments, the amorphous alloy film is doped with Ti, Al, Cr, Cu, Ni, Be, any suitable material, or the foregoing materials or combination. In some embodiments, the amorphous alloy film is doped with a rare earth element.

In the present embodiment, the amorphous alloy film has corrosion resistance, and a thin and dense passivation film is easily formed on the surface as a protective layer. In addition, the amorphous alloy film of the present embodiment does not have crystal grains, grain boundaries, or defects contained in metal crystals. Thereby, the amorphous alloy film of the present embodiment has high hardness (for example, the Vickers hardness (HV) of the amorphous alloy film is substantially between 1000 and 2000), high scratch resistance and great flexibility, and provides high rigidity characteristics. Therefore, the amorphous alloy with thinner thicknesses still provides sufficient structural strength. For example, the thickness of the amorphous alloy film is substantially between 350 nanometers (nm) and 1500 nanometers (nm), which is not limited thereto. In addition, the amorphous alloy film of the present embodiment insulates water or liquid from entering the flexible display 1.

In the embodiment, the high rigidity material layer 120 is a cermet film. The material of the cermet film includes a cermet. The cermet is a composite material composed of a ceramic and a metal and has the characteristics of the ceramic material and the characteristics of the metal material. For example, the cermet has characteristics such as high strength, high hardness, wear resistance, high melting point, oxidation resistance, and good chemical stability of ceramic materials. In addition, the cermet also has properties such as good metal toughness and plasticity of metal materials.

Specifically, the metallic material in the cermet serves as a binder for the ceramic material. In the embodiment, the used metal element is iron (Fe), cobalt (Co), nickel (Ni), chromium (Cr), tungsten (W), molybdenum (Mo), any suitable metal, any combination of the foregoing materials, or alloy formed by any combination of the foregoing materials. In some embodiments, the cermet is a metal matrix composite. Further, the cermet used in the cermet film is an oxide-based cermet, a carbide-based cermet, a nitride-based cermet, a boride-based cermet, a telluride-based cermet, or any combination thereof. Thereby, the cermet film of the present embodiment has high hardness and scratch resistance, maintains flexibility, and provides high rigidity characteristics. Therefore, the cermet film with thinner thicknesses still provides sufficient structural strength. For example, the thickness of the cermet film is substantially between 350 nm and 1500 nm, which is not limited herein. In addition, the cermet film of the present embodiment insulates water or liquid from entering the flexible display 1.

For example, the oxide-based cermet includes an alumina ($Al_2O_3$)-based cermet, or a zirconia ($ZrO_2$)-based cermet. Further, in some embodiments, the alumina-based cermet is doped with chromium (Cr) or chromium molybdenum molybdenum alloy (CrMo). When the chromium content or the chromium-molybdenum alloy in the alumina-based cermet is increased, the mechanical strength of the doped alumina-based cermet is increased. Thereby, the mechanical strength of the high rigidity material layer 120 including the cermet film is increased.

For example, the carbide-based cermet includes a tungsten carbide (WC)-based cermet, a titanium carbide (TiC)-based cermet, or a chromium carbide ($Cr_3C_2$)-based cermet. Further, in some embodiments, the carbide-based cermet is doped with cobalt (Co). When the carbide-based cermet is doped with cobalt, the yield strength of the material of the doped carbide-based cermet is increased. In addition, for example, the hardness (HRC) of the doped carbide-based cermet is substantially 80 to 92, and the compressive strength is substantially 6000 mega-ohms (MPa, 10.2 kg/cm2). As a result, the hardness of the material of the high rigidity material layer 120 including the cermet film and the yield strength of the material is increased.

FIG. 2 shows a flowchart of a method 100 for manufacturing the flexible display 1 in some embodiments. FIG. 3A to FIG. 3E illustrate a cross-sectional view of a flexible display 1 in every manufacturing stage in an embodiment.

Although the method 100 for manufacturing the disclosed flexible display 1 is illustrated and described herein as a series of steps or events, it should be understood that the illustrated order of such steps or events is not to be interpreted in a limiting sense. For example, some steps occur in different orders and/or concurrently with other steps or events in addition to the order illustrated and/or described herein. In addition, implementing one or more of the embodiments described herein does not require depicting all operations. Further, one or more of the steps described herein may be implemented in one or more separate steps and/or stages. Specifically, the method 100 for manufacturing the flexible display 1 includes steps 1001 to 1008.

Figure 3A:
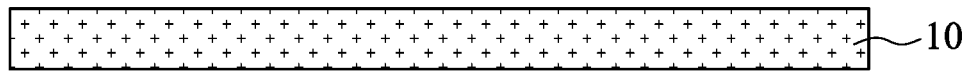
FIG. 3A to FIG. 3E illustrate a cross-sectional view of a flexible display in an intermediate manufacturing stage in an embodiment.

In step 1001, a substrate 10 is provided. In this embodiment, the substrate 10 is a glass substrate. FIG. 3A illustrates some embodiments corresponding to step 1001. In other embodiments, the substrate 10 of the present embodiment is a metal substrate.

Figure 3B:
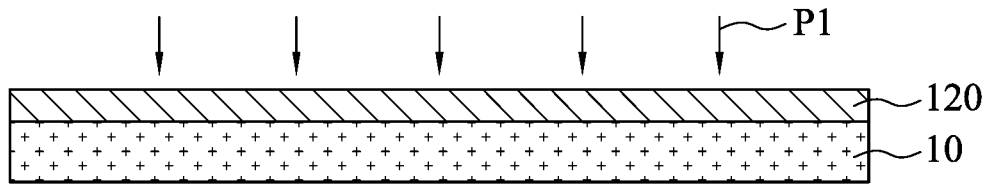

In step 1002, a high rigidity material layer 120 is deposited on the substrate 10 at a first temperature T1 by a first deposition process P1 in a processing chamber 24 (shown in FIG. 4) of a process system 2. FIG. 3B illustrates some embodiments corresponding to step 1002. In the embodiment, the first deposition process P1 is dry coating process, and includes an evaporation process, a sputtering process, ion plating, or any other suitable process. In addition, the first temperature T1 in the first deposition process P1 of the present embodiment is substantially between about 400° C. and 500° C., the process pressure is lower than 0.01 Torr, and the process environment includes nitrogen. For example, the first temperature T1 in the first deposition process P1 is substantially 450° C. However, the disclosure is not limited to the aforementioned process parameters.

In the embodiment, the high rigidity material layer 120 is an amorphous alloy film. Therefore, after depositing the alloy material on the substrate 10 at the first temperature T1, the deposited alloy material is rapidly cooled in the processing chamber 24 to form the amorphous alloy film, which is not limited herein, any suitable method can be applied to the disclosure. The method of forming an amorphous alloy film further includes a multilayer film interface interdiffusion reaction amorphous method, a mechanical alloying method, an ion mixing method, an inverse melting method, a hydrogen induced amorphization method, and a pressure induced amorphization method, or any method suitable for forming an amorphous alloy film.

Figure 3C:
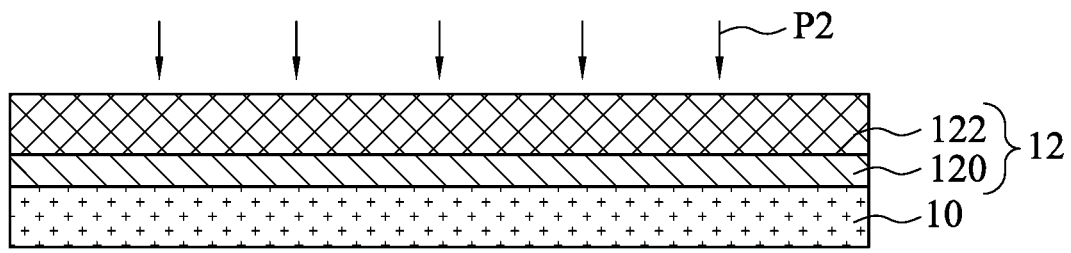

In step 1003, a transfer layer 122 is formed on the high rigidity material layer 120 at a second temperature T2 by a second deposition process P2 in the processing chamber 24 (shown in FIG. 4) of the process system 2 to form the coating film 12. The second temperature T2 in step 1003 is lower than the first temperature T1 in step 1002. FIG. 3C illustrates some embodiments corresponding to step 1003. In the embodiment, the second temperature T2 in the second deposition process P2 is higher than 180° C., and lower than the first temperature T1 in step 1002, and the process pressure is lower than 0.01 Torr. However, the disclosure is not limited to the aforementioned process parameters. In the embodiment, depositing the high rigidity material layer 120 and depositing the transfer layer 122 (the step of forming the coating film 12) are performed in the same processing chamber 24.

In step 1004, the process environment of the processing chamber 24 of the process system 2 is de-vacuumed (for example, the process pressure of the process environment is increased from about 0.01 Torr to about 760 Torr), and the substrate 10 and the coating film 12 are removed from the processing chamber 24.

In step 1005, the display surface 160 of the display panel 16 is cleaned.

In step 1006, the adhesive layer 18 is coated on the display panel 16 close to the display surface 160 to increase the adhesion strength between the coating film 12 and the display panel 16. In the embodiment, the material of the adhesive layer 18 is a liquid silicon oxide, and the coating method of the liquid silicon oxide 18 includes a spray coating process, a laminating process, an electrostatic process, an airless spray process or any suitable process. However, the disclosure is not limited herein, and any suitable material and process can be applied to the adhesive layer 18. In the present embodiment, the thickness of the adhesive layer 18 is less than 2 micrometers (μm).

Figure 3D:
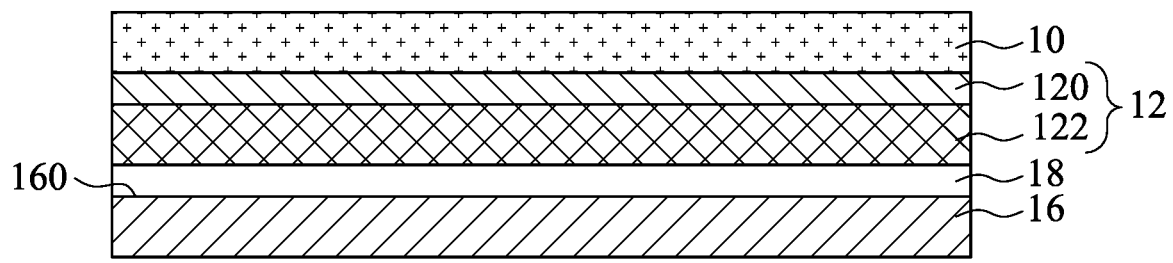

In step 1007, the coating film 12 and the substrate 10 are bonded to the side of the display panel 16 close to the display surface 160 via the transfer layer 122. FIG. 3D illustrates some embodiments corresponding to step 1007. For example, the display panel 16 is attached to the coating film 12 by a suitable laminating machine (not shown). Next, the coating film 12 and the substrate 10 are placed on the lamination machine. Then, the display panel 16 is adhered to the transfer layer 122 on the coating film 12 via the adhesive layer 18 by the laminating machine, so that the mutual adhering of the display panel 16 and the coating film 12 can be completed, which is not limited herein, and any suitable lamination process can be applied to the disclosure. In other embodiments, the adhesion layer 18 is omitted from the flexible display 1, and the display panel 16 is directly attached to the transfer layer 122 on the coating film 12 by a laminating machine to complete the mutual adhesion of the display panel 16 and the coating film 12.

Figure 3E:
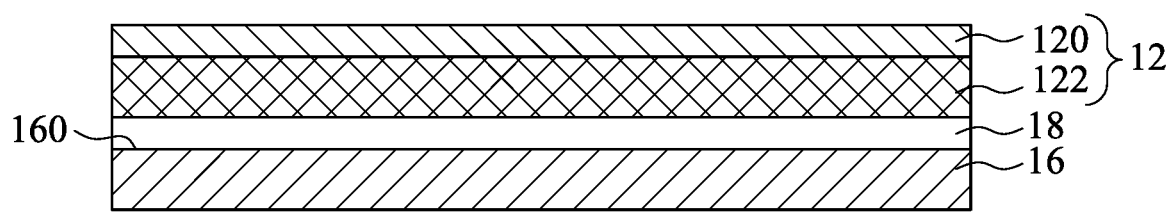

In step 1008, the substrate 10 is removed to complete the manufacture of the flexible display 1. FIG. 3E illustrates some embodiments corresponding to step 1008.

Figure 4:
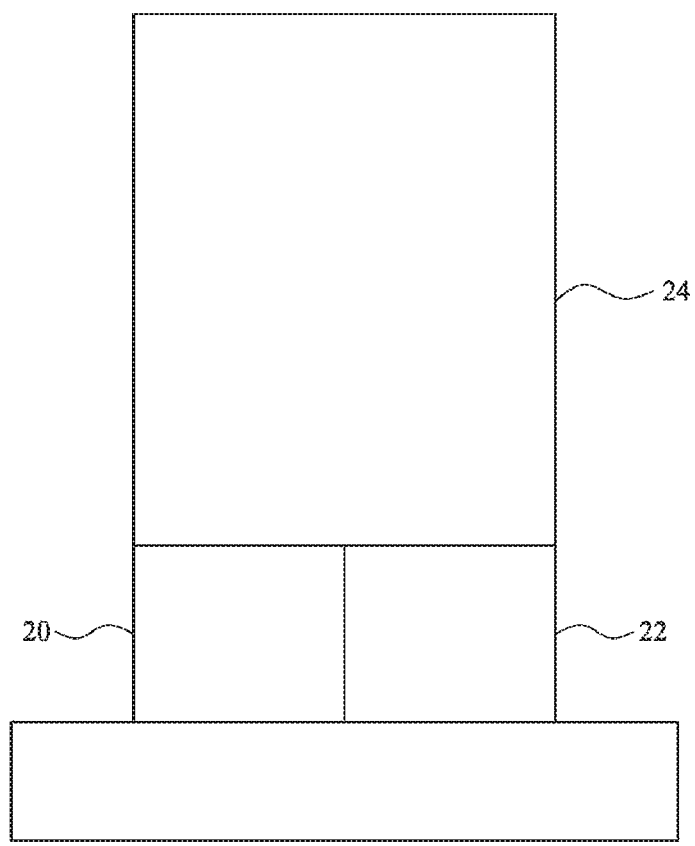
FIG. 4 illustrates a top view of an exemplary process system in some embodiments of the present disclosure.

Please refer to FIG. 4, and FIG. 4 illustrates a top view of an exemplary process system 2 in some embodiments of the present disclosure. As shown in FIG. 4, in the embodiment, the process system 2 includes a loading chamber 20, a load lock chamber 22, and processing chambers 24. In some embodiments, the loading chamber 20 and the load lock chamber 22 of the process system 2 provide the substrate 10 (shown in FIG. 3A) into the process system 2, and provide the substrate 10 with the coating film 12 (shown in FIG. 3C) moving out of the process system 2.

In some embodiments, the process system 2 is in a vacuum condition, and exhaust (by a mechanical pump and/or a turbo molecular pump) the loading chamber 20 and the load lock chamber 22 of the process system 2 to bring the substrate 10 (shown in FIG. 3A) in the process system 2. In some embodiments, the loading chamber 20 and the load lock chamber 22 of the process system 2 is adapted to receive one substrate 10 or multiple substrates 10 (for example, multiple substrates 10 are loaded in a carrier box). In an embodiment, the loading chamber 20 and the load lock chamber 22 of the process system 2 is isolated from the processing chamber 24 of the process system 2 by the gate valve, and therefore keeps the processing chamber 24 of the process system 2 maintained under vacuum condition when one or both of the loading chamber 20 and the load lock chamber 22 of the process system 2 are not under vacuum condition due to deflation. In some embodiments, the substrate 10 (shown in FIG. 3A) or the coating film 12 (shown in FIG. 3C) enter and exit the process system 2 through the same chamber without setting the loading chamber 20 and the load lock chamber 22 at the same time.

From the above detailed description of the specific embodiments of the present disclosure, it is apparent that the high rigidity material layer of the present disclosure has high hardness, high scratch resistance, great flexibility, and provides high rigidity characteristics. Therefore, the high rigidity material layer with thinner thicknesses still provides sufficient structural strength. For example, the thickness of the cermet film is substantially between 350 nanometers and 1500 nanometers. In addition, the high rigidity material layer further provides liquid-prove feature to the flexible display.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A method for manufacturing a flexible display, comprising:
    forming a coating film, including:
        depositing an amorphous alloy film on a substrate, wherein depositing the amorphous alloy film is performed at a first temperature; and
        forming a silicon oxide transfer layer on the amorphous alloy film to form the coating film, wherein forming the silicon oxide transfer layer is performed at a second temperature higher than 180° C. and lower than the first temperature, and the silicon oxide transfer layer has a thickness thinner than the amorphous alloy film;
    bonding the coating film to a display surface of a display panel via the silicon oxide transfer layer; and
    removing the substrate after bonding the coating film to the display surface of the display panel.

2. The method according to claim 1, wherein the step of bonding the coating film to the display surface of the display panel via the silicon oxide transfer layer includes:
    coating an adhesive layer comprising silicon oxide on the display surface of the display panel before bonding the coating film to the display panel.

3. The method according to claim 1, wherein the step of forming the coating film is performed in a same processing chamber.

4. The method according to claim 1, wherein
the first temperature is between 400° C. to 500° C.

5. The method according to the claim 1, wherein the step of depositing the amorphous alloy film on the substrate includes:
    depositing the amorphous alloy film on the substrate by a dry coating process.

\* \* \* \* \*